(12) United States Patent
Simon

(10) Patent No.: US 9,333,946 B2
(45) Date of Patent: May 10, 2016

(54) SYSTEM AND METHOD FOR IDENTIFYING VEHICLE BY UTILIZING DETECTED MAGNETIC FIELD

(71) Applicant: Sascha Simon, Warwick, NY (US)

(72) Inventor: Sascha Simon, Warwick, NY (US)

(73) Assignee: APIO SYSTEMS, INC., Rochelle Park, NJ (US)

( * ) Notice: Subject to any disclaimer, the term of this patent is extended or adjusted under 35 U.S.C. 154(b) by 445 days.

(21) Appl. No.: 14/072,231

(22) Filed: Nov. 5, 2013

(65) Prior Publication Data

US 2014/0180615 A1     Jun. 26, 2014

Related U.S. Application Data

(60) Provisional application No. 61/740,814, filed on Dec. 21, 2012, provisional application No. 61/740,831, filed on Dec. 21, 2012, provisional application No. 61/740,851, filed on Dec. 21, 2012, provisional application No. 61/745,677, filed on Dec. 24, 2012.

(51) Int. Cl.
*G06F 19/00* (2011.01)
*B60R 25/24* (2013.01)

(52) U.S. Cl.
CPC ..................................... *B60R 25/24* (2013.01)

(58) Field of Classification Search
CPC .... B60R 25/24; A61B 5/0022; A61B 5/1118; A61B 2560/0214
USPC ............. 702/65, 64, 150, 155, 182–185, 188
See application file for complete search history.

(56) References Cited

U.S. PATENT DOCUMENTS

| 5,785,347 A | 7/1998 | Adolph et al. |
| 6,411,250 B1 | 6/2002 | Oswald et al. |
| 7,136,828 B1 | 11/2006 | Allen et al. |

(Continued)

FOREIGN PATENT DOCUMENTS

| EP | 0461688 A2 | 12/1991 |
| JP | 10-260241 A | 9/1998 |

(Continued)

OTHER PUBLICATIONS

PCT/US2013/076432 International Search Report and Written Opinion, Apr. 9, 2014, Ham, Joung Hyun.

(Continued)

*Primary Examiner* — Edward Raymond
(74) *Attorney, Agent, or Firm* — John T. Whelan

(57) ABSTRACT

A device includes a field-detecting component, an input component, an accessing component, a comparing component and an identifying component. The field-detecting component can detect a field and generate a detected field signature based thereon. The input component can input the detected field signature into a database. The accessing component can access the detected field signature from the database. The comparing component can generate a comparison signal. The identifying component can identify item or location based on the comparison signal. The field-detecting component can further detect a second field and generate a second detected field signature based on the detected second field. The comparing component can generate the comparison signal based on a comparison of the detected field signature and the second detected field signature.

42 Claims, 10 Drawing Sheets

(56) References Cited

U.S. PATENT DOCUMENTS

| | | |
|---|---|---|
| 7,415,126 B2 | 8/2008 | Breed et al. |
| 7,904,053 B2 | 3/2011 | Krasner et al. |
| 8,082,014 B2 | 12/2011 | Causey et al. |
| 9,286,783 B1 * | 3/2016 | Teller .................... G08B 21/24 |
| 2003/0029345 A1 | 2/2003 | Tiernan et al. |
| 2003/0209893 A1 | 11/2003 | Breed et al. |
| 2004/0152471 A1 | 8/2004 | Macdonald et al. |
| 2004/0257208 A1 | 12/2004 | Huang et al. |
| 2006/0085153 A1 | 4/2006 | Oesterling et al. |
| 2006/0089153 A1 | 4/2006 | Sheynblat |
| 2007/0021915 A1 | 1/2007 | Breed et al. |
| 2008/0040004 A1 * | 2/2008 | Breed ................. B60R 21/0134 701/45 |
| 2008/0203814 A1 | 8/2008 | Kamiya |
| 2008/0287143 A1 | 11/2008 | Banks et al. |
| 2009/0037056 A1 | 2/2009 | Erb |
| 2009/0309709 A1 | 12/2009 | Bevacqua et al. |
| 2010/0063649 A1 | 3/2010 | Wu et al. |
| 2011/0169654 A1 | 7/2011 | Ketari |
| 2011/0301795 A1 | 12/2011 | Failing |
| 2012/0123634 A1 | 5/2012 | Shimizu |
| 2012/0135764 A1 | 5/2012 | Ohashi |
| 2012/0158249 A1 | 6/2012 | Xu et al. |
| 2012/0208517 A1 | 8/2012 | Zohar |
| 2012/0282885 A1 | 11/2012 | Hamed et al. |
| 2013/0130639 A1 | 5/2013 | Oesterling et al. |
| 2013/0253775 A1 | 9/2013 | Shimizu |
| 2014/0179348 A1 | 6/2014 | Simon |
| 2014/0179353 A1 | 6/2014 | Simon |
| 2014/0180563 A1 | 6/2014 | Simon |
| 2014/0180615 A1 | 6/2014 | Simon |

FOREIGN PATENT DOCUMENTS

| | | |
|---|---|---|
| JP | 2007-183865 A | 7/2007 |
| JP | 2009-177758 A | 8/2009 |
| WO | WO 03-095276 A1 | 11/2003 |

OTHER PUBLICATIONS

PCT/US2013/076410 International Search Report and Written Opinion, Apr. 7, 2014, Song, Ho Keun.

PCT/US2013/076426 International Search Report and Written Opinion, Apr. 9, 2014, Ham, Joung Hyun.

PCT/US2013/076440 International Search Report and Written Opinion, Apr. 9, 2014, Sohn, Byoung Cheol.

* cited by examiner

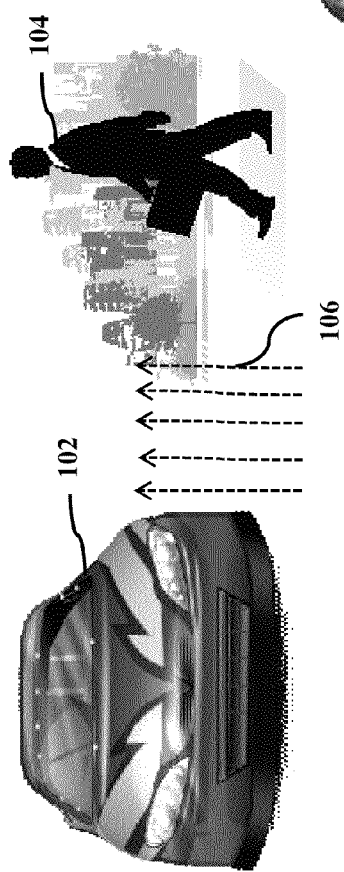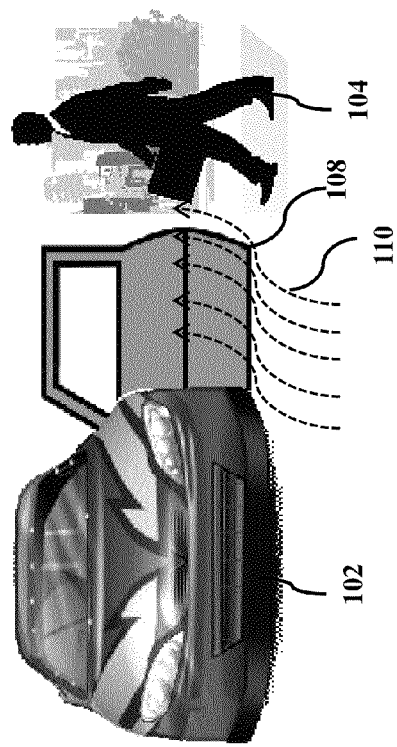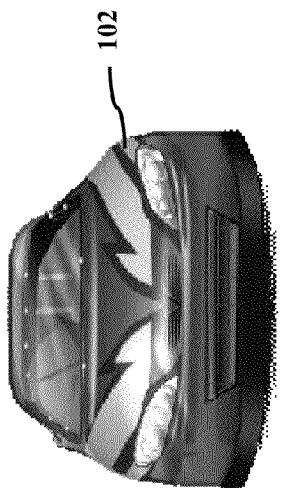
FIG. 1A
FIG. 1B
FIG. 1C

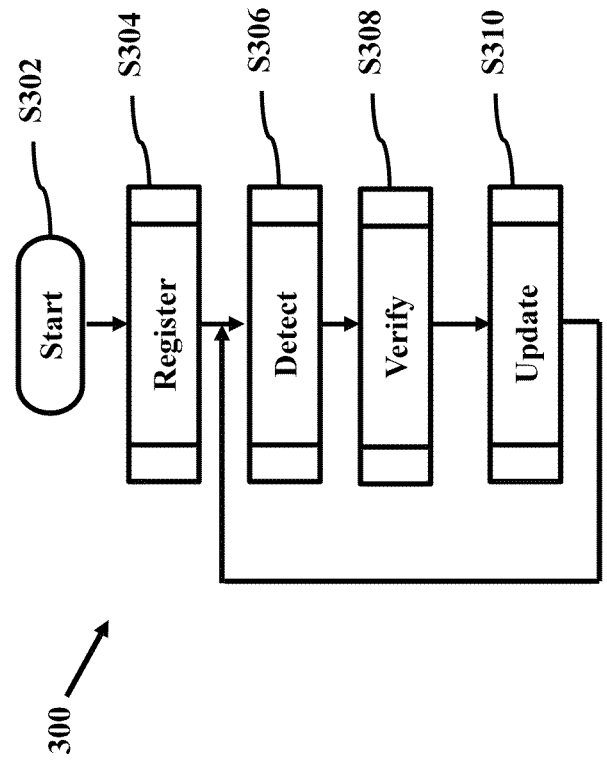
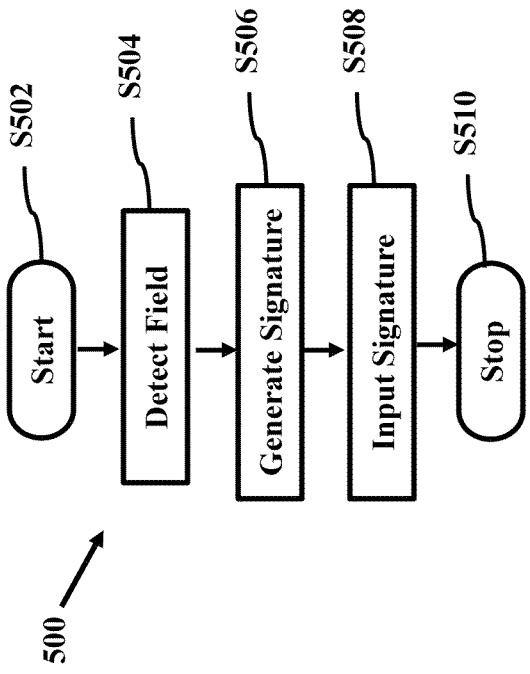

SYSTEM AND METHOD FOR IDENTIFYING VEHICLE BY UTILIZING DETECTED MAGNETIC FIELD

The present application claims priority from: U.S. Provisional Application No. 61/740,814 filed Dec. 21, 2012; U.S. Provisional Application. No. 61/740,831 filed Dec. 21, 2012; U.S. Provisional Application No. 61/740,851 filed Dec. 21, 2012; and U.S. Provisional Application No. 61/745,677 filed Dec. 24, 2012, the entire disclosures of which are incorporated herein by reference.

BACKGROUND

Vehicle telematics is the technology of sending, receiving and storing information to and from vehicles and is generally present (at least to a limited extent) in the automotive marketplace today. For example, both General Motors (through their OnStar offering) and Mercedes Benz (through their Tele-Aid and more recent embrace system offering) have long offered connected-vehicle functionality to their customers. Both of these offerings make use of the data available on a vehicle's CAN bus, which is specified in the OBD-II vehicle diagnostics standard. For example, the deployment of an airbag, which suggests that the vehicle has been involved in a crash, may be detected by monitoring the CAN bus. In this event, a digital wireless telephony module that is embedded in the vehicle and connected to the vehicle's audio system (i.e., having voice connectivity) can initiate a phone call to a telematics service provider (TSP) to "report" the crash. Vehicle location may also be provided to the TSP using the vehicle's GPS functionality. Once the call is established, the TSP representative may attempt to communicate with the vehicle driver, using the vehicle's audio system, to assess the severity of the situation. Assistance may thus be dispatched by the TSP representative to the vehicle as appropriate.

Historically, these services were focused entirely on driver and passenger safety. These types of services have expanded since their initial roll-out, however, and now offer additional features to the driver, such as concierge services. The services, however, remain mainly focused on voice based driver to call center communication, with data services being only slowly introduced, hindered by low bandwidth communication modules, high cost and only partial availability on some model lines.

As a result, while generally functional, vehicle telematics services have experienced only limited commercial acceptance in the marketplace. There are several reasons for this. In addition to low speeds and bandwidth, most vehicle drivers (perhaps excluding the premium automotive market niche) are reluctant to pay extra for vehicle telematics services, either in the form of an upfront payment (i.e., more expensive vehicle) or a recurring (monthly/yearly) service fee. Moreover, from the vehicle manufacturer's perspective, the services require additional hardware to be embedded into the vehicle, resulting in extra costs on the order of $250 to $350 or more per vehicle which cannot be recouped. Thus, manufacturers have been slow to fully commit to or invest in the provision of vehicle telematics equipment in all vehicles.

There have been rudimentary attempts in the past to determine when a smartphone is in a moving vehicle. Wireless service provider AT&T, Sprint and Verizon, for example, offer a smartphone application that reacts in a specific manner to incoming text messages and voice calls when a phone is in what AT&T calls DriveMode™. With the AT&T DriveMode™ application, a wireless telephone is considered to be in "drive mode" when one of two conditions are met. First, the smartphone operator can manually turn on the application, i.e., she "tells" the application to enter drive mode. Alternatively, when the DriveMode application is in automatic on/off mode and the smartphone GPS sensor senses that the smartphone is travelling at greater than 25 miles per hour, the GPS sensor so informs the DriveMode application, the DriveMode application concludes that the smartphone is in a moving vehicle, and drive mode is entered.

Both of these paths to engaging the AT&T DriveMode application—the "manual" approach to entering drive mode and the "automatic" approach to entering drive mode—are problematic. First, if the smartphone operator forgets or simply chooses not to launch the DriveMode application prior to driving the vehicle when the application is in manual mode then the application will not launch. Second, in automatic on/off mode AT&T's use of only the GPS sensor to determine when a smartphone is in a moving vehicle is problematic for a number of reasons. First, the speed threshold of the application is arbitrary, meaning that drive mode will not be detected/engaged at less than 25 mph. If the vehicle is stopped in traffic or at a traffic signal, for example, then the DriveMode application may inadvertently terminate. Second, and perhaps more importantly, AT&T's DriveMode application requires that the smartphone's GPS functionality be turned on at all times. Because the use of a smartphone's GPS sensor is extremely demanding to the battery resources of a smartphone, this requirement severely undermines the usefulness of AT&T's application. Thirdly this method does not differentiate between the type of vehicle that the phone is in, e.g. a bus, a taxi or a train and therefore allows no correlation between the owner of the phone and her driving situation. For the classic embedded telematics devices to be replaces by smartphones it is important to correlate the driver and smartphone owner with her personal vehicle. Only then the smartphone can truly take the functional role of an embedded telematics device in a vehicle.

Accordingly, for at least the foregoing reasons there exists a need and it is an object of the present invention to provide an improved method and apparatus of determining the specific identity and type of vehicle a smartphone is in.

SUMMARY

The present invention provides an improved method and apparatus of determining the specific identity and type of vehicle a smartphone is in.

Various embodiments described herein are drawn to a device, for use with a database. The device includes a field-detecting component, an input component, an accessing component, a comparing component and an identifying component. The field-detecting component can detect at least one of an electric field, a magnetic field and an electro-magnetic field and can generate a detected field signature based on the detected one of an electric field, a magnetic field and an electro-magnetic field. The input component can input the detected field signature into the database. The accessing component can access the detected field signature from the database. The comparing component can generate a comparison signal. The identifying component can identify one of an item and a location based on the comparison signal. The field-detecting component can further detect a second one of an electric field, a magnetic field and an electro-magnetic field and can generate a second detected field signature based on the detected second one of an electric field, a magnetic field and an electro-magnetic field. The comparing component can generate the comparison signal based on a comparison of the detected field signature and the second detected field signature.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings:

FIGS. 1A-C illustrate a person and a vehicle at times $t_1$, $t_2$ and $t_3$, respectively;

FIG. 3 illustrates an example method of identifying an item or a location in accordance with aspects of the present invention;

FIG. 5 illustrates an example method of registering an item or a location in accordance with aspects of the present invention;

DETAILED DESCRIPTION

Figure 2B:
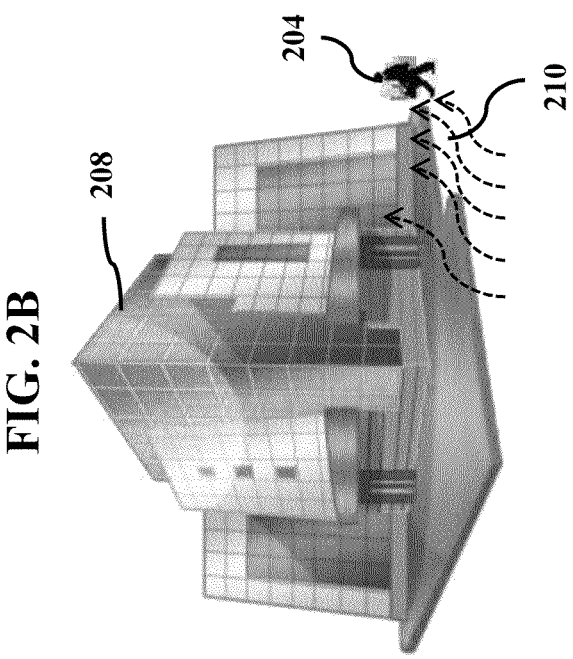
FIGS. 2A-B illustrate a house and a building, respectively.

Aspects of the present invention are drawn to a system and method for determining a specific item and/or location by utilizing field properties within and/or near the specific item and or location.

As used herein, the term "smartphone" includes cellular and/or satellite radiotelephone(s) with or without a display (text/graphical); Personal Communications System (PCS) terminal(s) that may combine a radiotelephone with data processing, facsimile and/or data communications capabilities; Personal Digital Assistant(s) (PDA) or other devices that can include a radio frequency transceiver and a pager, Internet/Intranet access, Web browser, organizer, calendar and/or a global positioning system (GPS) receiver; and/or conventional laptop (notebook) and/or palmtop (netbook) computer(s), tablet(s), or other appliance(s), which include a radio frequency transceiver. As used herein, the term "smartphone" also includes any other radiating user device that may have time-varying or fixed geographic coordinates and/or may be portable, transportable, installed in a vehicle (aeronautical, maritime, or land-based) and/or situated and/or configured to operate locally and/or in a distributed fashion over one or more location(s).

In one non-limiting example embodiment, a smartphone is used to measure a magnetic field associated with a vehicle to identify the vehicle. In another non-limiting example embodiment, a smartphone is used to measure a magnetic field associated with a house to identify the location of the user of the smartphone. These aspects will now be described in more detail with reference to FIGS. 1A-2B.

As shown in FIG. 1A, at time $t_1$, a magnetic field 106 is located near vehicle 102. For purposes of discussion, person 104 is holding a device (not shown) in accordance with an aspect of the present invention. In this specific example, the device in accordance with an aspect of the present invention is embodied in a smartphone. In this specific example, the smartphone is able to detect magnetic field 106.

As shown in FIG. 1B, at time $t_3$, the opening of door 108 affects the magnetic field located near vehicle 102, as shown by filed lines 110. Again the smartphone is able to detect magnetic field shown by field lines 110.

As shown in FIG. 1C, at time $t_3$, the smartphone is not detecting the magnetic field outside of vehicle 102.

In accordance with example aspects of the present invention, a smartphone carried by person 104 may identify vehicle 102 by aspects of magnetic field 102 or magnetic field 108. Non-limiting detectable aspects of the magnetic fields include an instantaneous magnitude, an instantaneous field vector, a magnitude as a function over a period of time, a field vector as a function over a period of time and combinations thereof.

In accordance with other example aspects of the present invention, a smartphone carried by person 104 may identify vehicle 102 by aspects of a change of magnetic field 102 to magnetic field 108. Non-limiting detectable aspects of the change magnetic fields include an instantaneous change in magnitude, an instantaneous change in field vector, a change in magnitude as a function over a period of time, a change in field vector as a function over a period of time and combinations thereof.

In addition to identifying an item, as discussed above with reference to FIGS. 1A-1C, aspects of the present invention may be used to identify a location.

Figure 2A:
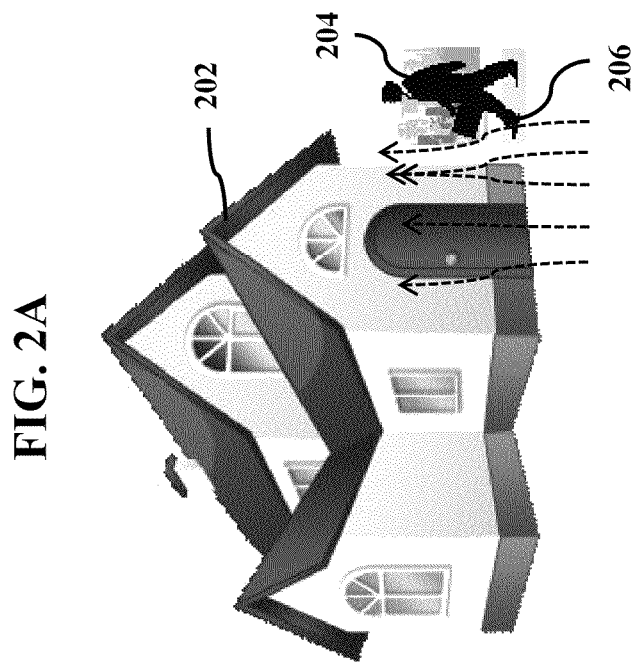

As shown in FIG. 2A, at time $t_4$, a person 204 is entering a house 202. A magnetic field 206 is located near house 202. For purposes of discussion, person 204 is holding a device (not shown) in accordance with an aspect of the present invention. In this specific example, the device in accordance with an aspect of the present invention is embodied in a smartphone. In this specific example, the smartphone is able to detect magnetic field 106.

As shown in FIG. 2B, at time $t_5$, person 204 is entering a building 208. A magnetic field 210 is located near building 208. Again the smartphone is able to detect magnetic field 210.

In accordance with example aspects of the present invention, a smartphone carried by person 104 may identify whether person 204 is entering house 202 or building 208 by aspects of magnetic field 206 or magnetic field 210.

A more detailed discussion of example working embodiment will now be discussed with additional reference to FIGS. 3-13.

FIG. 3 illustrates an example method 300 of identifying an item or a location in accordance with aspects of the present invention.

Method 300 starts (S302) and an item or location is registered (S304). For example, if a person would like to be able to identify their vehicle, the vehicle would be registered based on a field associated with the vehicle, whereas if a person would like to be able to identify a location such as their place of work, then the location would be registered based on a field associated with the vehicle. A more detailed discussion of registration will now be provided with additional reference to FIGS. 4-11.

Figure 4:
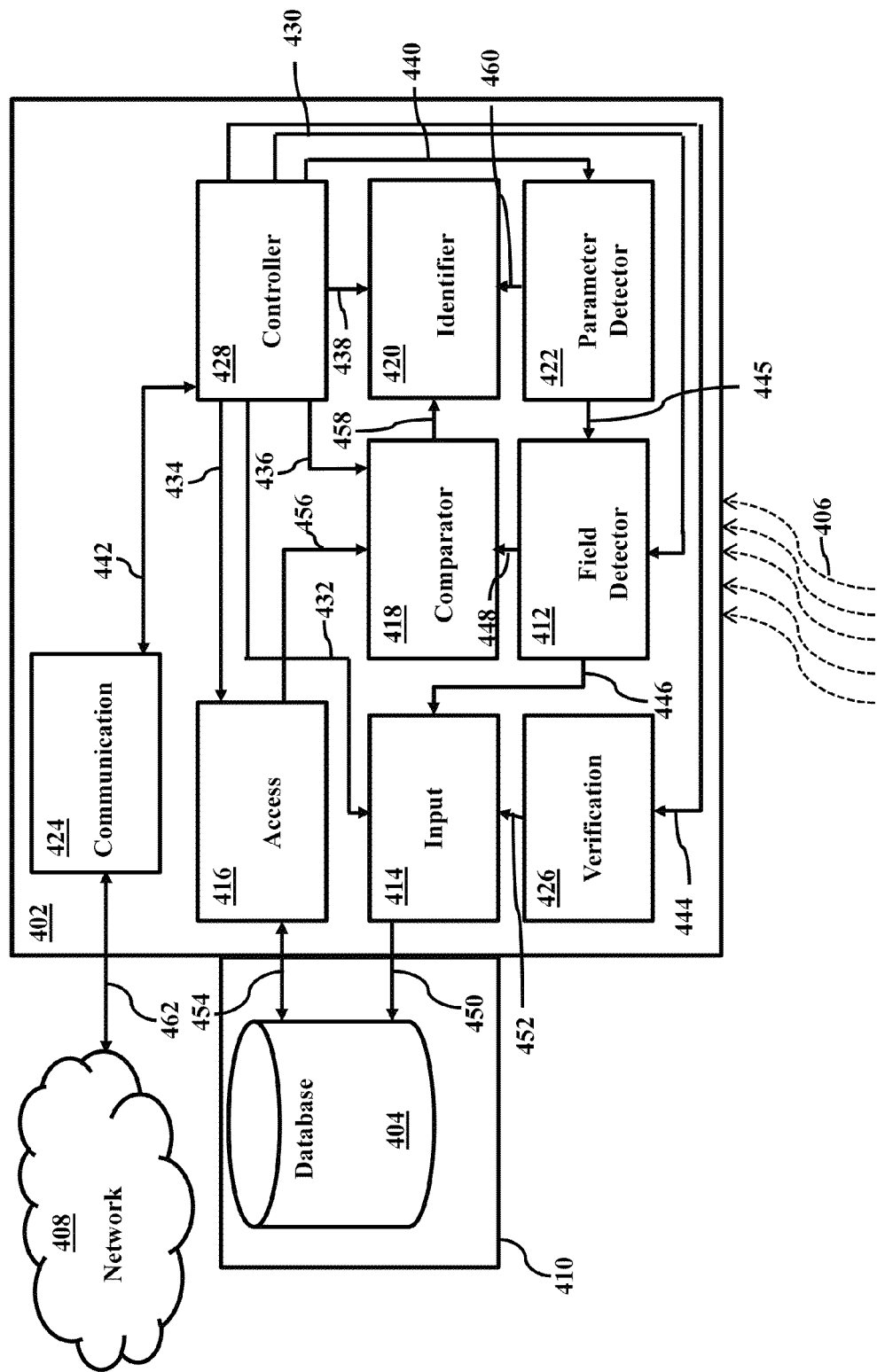
FIG. 4 illustrates an example device for identifying an item or a location in accordance with aspects of the present invention.

FIG. 4 illustrates an example device 402 for identifying an item or a location in accordance with aspects of the present invention.

FIG. 4 includes a device 402, a database 404, a field 406 and a network 408. In this example embodiment, device 402 and database 404 are distinct elements. However, in some embodiments, device 402 and database 404 may be a unitary device as indicated by dotted line 410.

Device 402 includes a field-detecting component 412, an input component 414, an accessing component 416, a comparing component 418, an identifying component 420, a parameter-detecting component 422, a communication component 424, a verification component 426 and a controlling component 428.

In this example, field-detecting component 412, input component 414, accessing component 416, comparing component 418, identifying component 420, parameter-detecting component 422, communication component 424, verification component 426 and controlling component 428 are illustrated as individual devices. However, in some embodiments, at least two of field-detecting component 412, input component 414, accessing component 416, comparing component 418, identifying component 420, parameter-detecting component 422, communication component 424, verification component 426 and controlling component 428 may be combined as a unitary device. Further, in some embodiments, at least one of field-detecting component 412, input component 414, accessing component 416, comparing component 418, identifying component 420, parameter-detecting component 422, communication component 424, verification component 426 and controlling component 428 may be implemented as a computer having tangible computer-readable media for carrying or having computer-executable instructions or data structures stored thereon. Such tangible computer-readable media can be any available media that can be accessed by a general purpose or special purpose computer. Non-limiting examples of tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. For information transferred or provided over a network or another communications connection (either hardwired, wireless, or a combination of hardwired or wireless) to a computer, the computer may properly view the connection as a computer-readable medium. Thus, any such connection may be properly termed a computer-readable medium. Combinations of the above should also be included within the scope of computer-readable media.

Controlling component 428 is arranged to communicate with: field-detecting component 412 via a communication line 430; input component 414 via a communication line 432; accessing component 416 via a communication line 434; comparing component 418 via a communication line 436; identifying component 420 via a communication line 438; parameter-detecting component 422 via a communication line 440; communication component 424 via a communication line 442; and verification component 426 via a communication line 444. Controlling component 428 is operable to control each of field-detecting component 412, input component 414, accessing component 416, comparing component 418, identifying component 420, parameter-detecting component 422, communication component 424 and verification component 426.

Field-detecting component 412 is additionally arranged to detect field 406, to communicate with input component 414 via a communication line 446, to communicate with comparing component 418 via a communication line 448 and to communicate with parameter-detecting component 422 via a communication line 445. Field-detecting component 412 may be any known device or system that is operable to detect a field, non-limiting examples of which include an electric field, a magnetic field, and electro-magnetic field and combinations thereof. In some non-limiting example embodiments, field-detecting component 412 may detect the amplitude of a field at an instant of time. In some non-limiting example embodiments, field-detecting component 412 may detect a field vector at an instant of time. In some non-limiting example embodiments, field-detecting component 412 may detect the amplitude of a field as a function over a period of time. In some non-limiting example embodiments, field-detecting component 412 may detect a field vector as a function over a period of time. In some non-limiting example embodiments, field-detecting component 412 may detect a change in the amplitude of a field as a function over a period of time. In some non-limiting example embodiments, field-detecting component 412 may detect a change in a field vector as a function over a period of time.

Input component 414 is additionally arranged to communicate with database 404 via a communication line 450 and to communicate with verification component 426 via a communication line 452. Input component 414 may be any known device or system that is operable to input data into database 404. Non-limiting examples of input component 414 include a graphic user interface (GUI) having a user interactive touch screen or keypad.

Accessing component 416 is additionally arranged to communicate with database 404 via a communication line 454 and to communicate with comparing component 418 via a communication line 456. Accessing component 416 may be any known device or system that access data from database 404.

Comparing component 418 is additionally arranged to communicate with identifying component 420 via a communication line 458. Comparing component 418 may be any known device or system that is operable to compare two inputs.

Parameter-detecting component 422 is additionally arranged to communicate with identifying component 422 via a communication line 460. Parameter-detecting component 422 may be any known device or system that is operable to detect a parameter, non-limiting examples of which include velocity, acceleration, angular velocity, angular acceleration, geodetic position, sound, temperature, vibrations, pressure, biometrics, contents of surrounding atmosphere and combinations thereof. In some non-limiting example embodiments, parameter-detecting component 422 may detect the amplitude of a parameter at an instant of time. In some non-limiting example embodiments, parameter-detecting component 422 may detect a parameter vector at an instant of time. In some non-limiting example embodiments, parameter-detecting component 422 may detect the amplitude of a parameter as a function over a period of time. In some non-limiting example embodiments, parameter-detecting component 422 may detect a parameter vector as a function over a period of time. In some non-limiting example embodiments, parameter-detecting component 422 may detect a change in the amplitude of a parameter as a function over a period of time. In some non-limiting example embodiments, parameter-detecting component 422 may detect a change in a parameter vector as a function over a period of time.

Communication component 424 is additionally arranged to communicate with network 408 via a communication line 462. Communication component 424 may be any known device or system that is operable to communicate with network 408. Non-limiting examples of communication component include a wired and a wireless transmitter/receiver.

Verification component 426 may be any known device or system that is operable to provide a request for verification. Non-limiting examples of verification component 426 include a graphic user interface having a user interactive touch screen or keypad.

Communication lines 430, 432, 434, 436, 438, 440, 442, 444, 445, 446, 448, 450, 452, 454, 456, 458, 460 and 462 may be any known wired or wireless communication line.

Database 404 may be any known device or system that is operable to receive, store, organize and provide (upon a request) data, wherein the "database" refers to the data itself and supporting data structures. Non-limiting examples of database 404 include a memory hard-drive and a semiconductor memory.

Network 408 may be any known linkage of two or more communication devices. Non-limiting examples of database 408 include a wide-area network, a local-area network and the Internet.

For purposes of discussion, consider the example where a person is registering their vehicle. In some example embodiments, the vehicle may be registered based on an approach and entry into the vehicle as discussed above with reference to FIGS. 1A-C. In some example embodiments, the vehicle may be registered based upon fields detected while the person using the device is within the vehicle. For purposes of discussion, consider the example where a person is registering their vehicle while sitting in the vehicle. In some example embodiments, the registration may be performed based upon fields detected while the vehicle is in a specific mode of operation, non-limiting examples of which include starting up, driving forward, driving in reverse, stopped, accelerating, decelerating and combinations thereof. For purposes of discussion, consider the following example where a person is registering their vehicle based on the starting up of the vehicle. This example will now be described with additional reference to FIG. 5.

FIG. 5 illustrates an example method 500 of registering an item or a location in accordance with aspects of the present invention.

Method 500 starts (S502) and a field is detected (S504). For example, returning to FIG. 4, field-detecting component 412 detects field 406. For purposes of discussion, let field 406 be a magnetic field corresponding to the superposition of magnetic fields generated by all electronic and mechanical systems involved with the ignition of the vehicle. Some example detected field will now be described with greater detail with reference to FIGS. 6-8.

Figure 6:
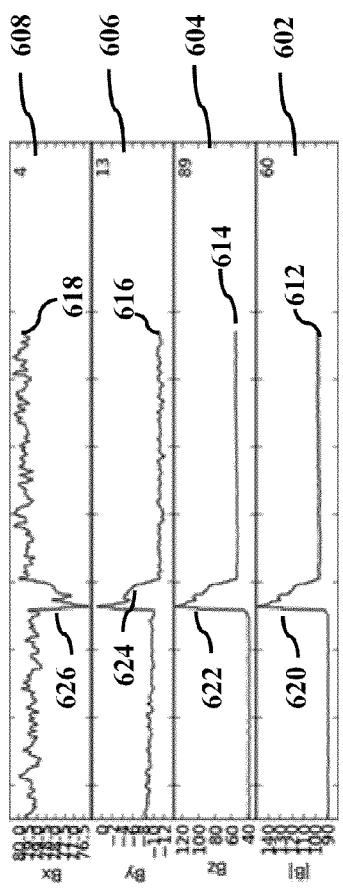
FIG. 6 illustrates an example of measured magnetic fields associated with a vehicle in accordance with aspects of the present invention.

FIG. 6 illustrates an example of measured magnetic fields associated with a specific vehicle in accordance with aspects of the present invention.

FIG. 6 includes a graph 602, a graph 604, a graph 606 and a graph 608, each of which share a common x-axis 610 in units of seconds. Graph 602 has a y-axis in units of $\mu T$ and includes a function 612. Graph 604 has a y-axis in units of $\mu T$ and includes a function 614. Graph 606 has a y-axis in units of $\mu T$ and includes a function 616. Graph 608 has a y-axis in units of $\mu T$ and includes a function 618.

Function 612 corresponds to the absolute value of the magnitude of a magnetic field vector (B) of the vehicle. Function 614 corresponds to the magnitude of B in a z-direction relative to field-detecting component 412. Function 616 corresponds to the magnitude of B in a y-direction relative to field-detecting component 412. Function 618 corresponds to the magnitude of B in an x-direction relative to field-detecting component 412.

A sudden change in the magnetic field manifests as spike 620 in function 612, as spike 622 in function 614, as spike 624 in function 616 and as spike 626 in function 618. This spike may be indicative of an event. For purposes of discussion, let this sudden change in the magnetic field correspond to the ignition of a particular vehicle. In this example therefore, the vehicle may have a signature based on functions 612, 614, 616 and 618, having tell-tail spikes 620, 622, 624 and 626, respectively. These functions may be easily distinguished from signatures based on different events, as will now be described with reference to FIG. 7.

Figure 7:
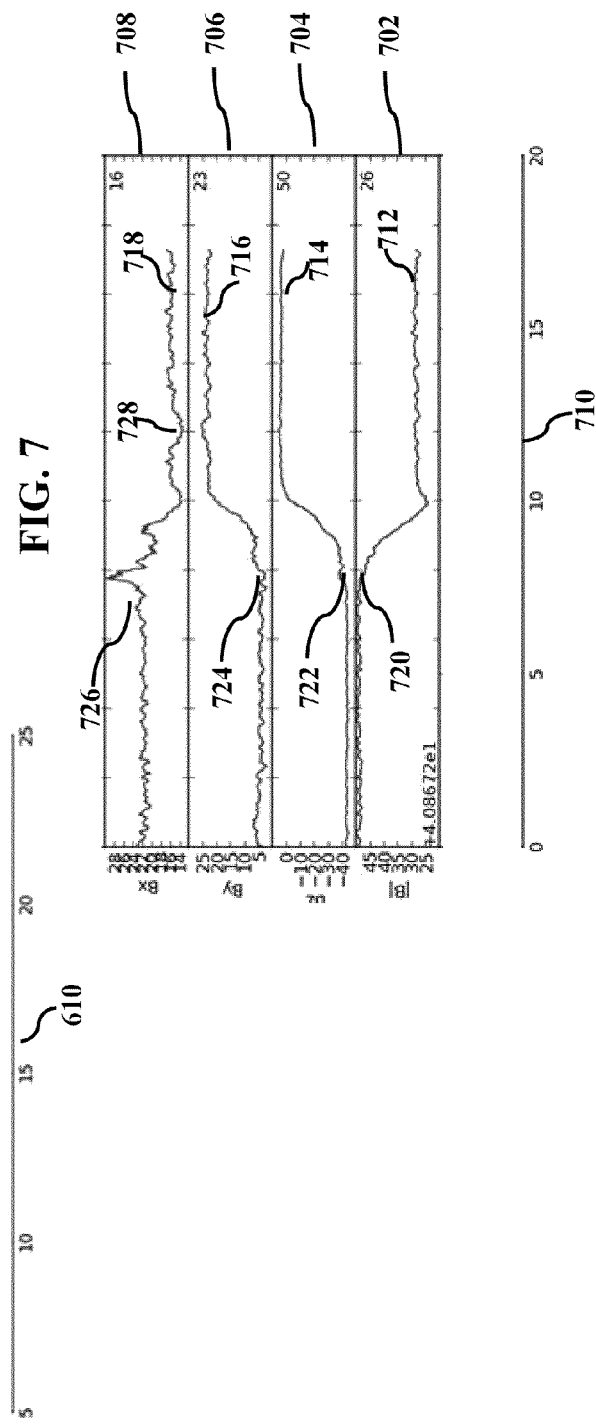
FIG. 7 illustrates another example of measured magnetic fields associated with a vehicle in accordance with aspects of the present invention.

FIG. 7 illustrates another example of measured magnetic fields associated with a second vehicle in accordance with aspects of the present invention.

FIG. 7 includes a graph 702, a graph 704, a graph 706 and a graph 708, each of which share a common x-axis 710 in units of seconds. Graph 702 has a y-axis in units of $\mu T$ and includes a function 712. Graph 704 has a y-axis in units of $\mu T$ and includes a function 714. Graph 706 has a y-axis in units of $\mu T$ and includes a function 716. Graph 708 has a y-axis in units of $\mu T$ and includes a function 718.

Function 712 corresponds to the absolute value of the magnitude of a B of the second vehicle. Function 714 corresponds to the magnitude of B in a z-direction relative to field-detecting component 412. Function 716 corresponds to the magnitude of B in a y-direction relative to field-detecting component 412. Function 718 corresponds to the magnitude of B in an x-direction relative to field-detecting component 412.

By comparing the overall magnitudes of the detected magnetic fields between FIG. 6 and FIG. 7 it is clear that the fields are associated with two different vehicles. However, there are additional differences between the detected fields worth noting. A change in the magnetic field of FIG. 7 manifests as a curve 720 in function 712, as a curve 722 in function 714, as a curve 724 in function 716 and as a spike 726 in function 718. A commonality of each of these features is a rotation of the magnetic field, which may be indicative of an event. In this example, the relatively smooth transition of the magnetic field in more than one axis as shown in functions 714 and 716, is indicative of a smooth movement of the detecting device within the detected magnetic field. For purposes of discussion, let this smooth change in the magnetic field correspond to the person, holding the device, entering a vehicle. Also noteworthy is a sudden change 728 in function 718. This change which is detected in only one axis may be indicative of another event. For purposes of discussion, let this sudden change correspond to ignition of the vehicle. Therefore, in this example, the action of entering a specific vehicle and starting that specific vehicle may have a signature based on functions 712, 714, 716 and 718.

Figure 8:
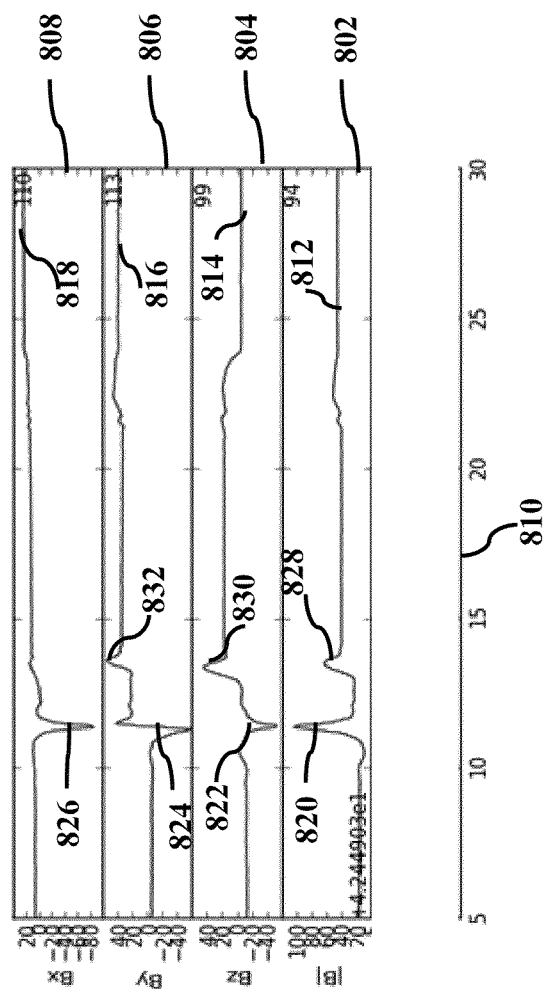
FIG. 8 illustrates another example of measured magnetic fields associated with a vehicle in accordance with aspects of the present invention.

FIG. 8 illustrates another example of measured magnetic fields associated with a third vehicle in accordance with aspects of the present invention.

FIG. 8 includes a graph 802, a graph 804, a graph 806 and a graph 808, each of which share a common x-axis 810 in units of seconds. Graph 802 has a y-axis in units of μT and includes a function 812. Graph 804 has a y-axis in units of μT and includes a function 814. Graph 806 has a y-axis in units of μT and includes a function 816. Graph 808 has a y-axis in units of μT and includes a function 818.

Function 812 corresponds to the absolute value of the magnitude of a B of the third vehicle. Function 814 corresponds to the magnitude of B in a z-direction relative to field-detecting component 412. Function 816 corresponds to the magnitude of B in a y-direction relative to field-detecting component 412. Function 818 corresponds to the magnitude of B in an x-direction relative to field-detecting component 412.

A sudden change in the magnetic field manifests as a curve 820 in function 812, as a spike 822 in function 814, as a spike 824 in function 816 and as a spike 826 in function 818. A commonality of each of these features is a brief rotation of the magnetic field, which may be indicative of an event. In this example, the very brief rotation of the magnetic field in more than one axis, is indicative of a rotation the detecting device within the detected magnetic field. For purposes of discussion, let this quick change in the magnetic field correspond to the person, holding the device, entering a vehicle. Also noteworthy is a small bump 828 in function 812, a small bump 830 in function 814 and a small bump 832 in function 816. This small bump, which is detected in only two axes may be indicative of another event. For purposes of discussion, let this change correspond to ignition of the vehicle. Therefore, in this example, the action of entering a specific vehicle and starting that specific vehicle may have a signature based on functions 812, 814, 816 and 818.

Returning to FIG. 5, once the field is detected (S504), a signature is generated (S506). In some embodiments, for example as shown in FIG. 4, field-detecting component 412 may generate a signature of the vehicle based any of functions 612, 614, 616, 618 of FIG. 6, and combinations thereof. In some embodiments, field-detecting component 412 may additionally process any of functions 612, 614, 616, 618 and combinations thereof to generate such a signature. Non-limiting examples of further processes include averaging, adding, subtracting, and transforming any of functions 612, 614, 616, 618 and combinations thereof.

Returning to FIG. 5, once the signature is generated (S506), the signature in input into memory (S508). For example, as shown in FIG. 4, field-detecting component 412 provides the signature to input component 414 via communication line 446.

In an example embodiment, input component 414 includes a GUI that informs a user of device 402 that a signature has been generated. Input component 414 may additionally enable the user to input an association between and item or location and the generated signature. For example, input component 414 may display on a GUI a message such as "A signature was generated. To what item/location is the signature associated?" Input component 414 may then display an input prompt for the user to input, via the GUI, an item/location to be associated with the generated signature.

Input component 414 may then provide the signature, and the association to a specific item or location, to database 404 via communication line 450.

As discussed above, in some embodiments, database 404 is part of device 402, whereas in other embodiments, database 404 is separate from device 402. Data input and retrieval from database 404 may be faster when database 404 part of device 402, as opposed to cases where database 404 is distinct from device 402. However, size may be a concern when designing device 402, particularly when device 402 is intended to be a handheld device such as a smartphone. As such, device 402 may be much smaller when database 404 is distinct from device 402, as opposed to cases where database 404 is part of device 402.

Consider an example embodiment, where database 404 is part of device 402. In such cases, input component 414 may enable a user to input signatures and the item/location associations, for a predetermined number of items/locations. In this manner, database 404 will only be used for device 402.

Now consider an example embodiment, where database 404 is separate from device 402. Further, let database 404 be much larger than the ease where database 404 is part of device 402. Still further, let database 404 be accessible to other devices in accordance with aspects of the present invention. In such cases, input component 414 may enable a user to input signatures and the item/location associations, for a much larger predetermined number of items/locations. Further, in such cases, input component 414 may enable other users of similar devices to input signatures and the item/location associations, for even more items/locations.

An example embodiment may use the differentiating magnetic field properties between different vehicle types and makes to identify the different vehicle types and makes. Today's vehicles are fully equipped with electronic and mechanical actuators and switches, engine subsystems. All these subsystems are generating their own electromagnetic and magnetic fields and therefore will alter the overall three-dimensional properties and field strength fluctuations of the vehicle interior. Particularly the ignition of a vehicle generates a characteristic magnetic flux for every vehicle. Aspects of the present invention include a storing these field properties as signatures within database 404 through measurements in the near field within the vehicle interior for a reference group of make and models. As such, any user of a device may be able to identify a registered vehicle within database 404. Thus, through previously stored signatures and additional measurements, the present invention enables a library of vehicular electromagnetic signatures. This library may be augmented with additional measurements describing the electromagnetic signatures of different vehicles. This will be described in greater detail later with reference to FIG. 13.

At this point, method 500 stops (S510).

In the examples discussed above with respect to FIGS. 6-8, field-detecting component 412 is detecting magnetic fields as field vectors as functions over a period of time. The detected signals illustrated in FIGS. 6-8 are easily distinguishable from one another. Accordingly, the vehicles associated therewith, respectively, may additionally be easily distinguishable from one another.

Returning to FIG. 5, method 500 may involve the detection of additional parameters to associate with an item or location. Specifically, additional aspects of the present invention are drawn to a system and method for determining a specific item and/or location by utilizing: 1) field properties within and/or near the specific item and or location; and 2) additionally detected parameters. In one non-limiting example embodiment, a smartphone is used to measure a magnetic field associated with a vehicle, and to measure velocity and/or acceleration whether the user of the smartphone is in an identified vehicle.

For example, returning to FIG. 4, parameter-detecting component 422 may be used to detect another parameter for use in detecting the vehicle. For purposes of discussion, consider the example where a person is registering their vehicle based on the walking up to the vehicle, entering the vehicle and starting up of the vehicle, wherein parameter-detecting component 422 measured various accelerations of the device as it is being carried by the person. This example will now be described with additional reference to FIGS. 9-11.

Figure 9:
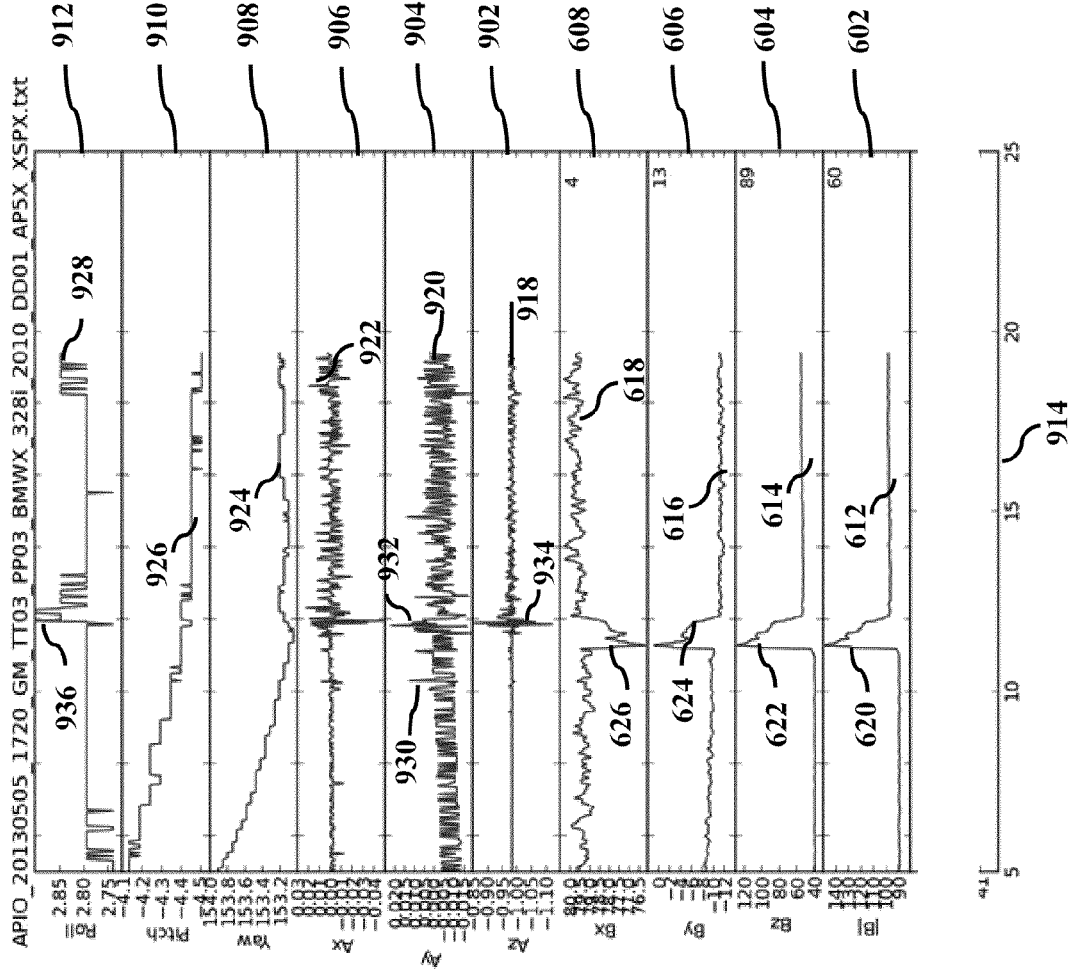
FIG. 9 illustrates an example of measured magnetic fields and of measured acceleration associated with a vehicle in accordance with aspects of the present invention.

FIG. 9 illustrates an example of measured magnetic fields and of measured acceleration associated with the device being carried in accordance with aspects of the present invention.

FIG. 9 includes graph 602, graph 604, graph 606 and graph 608, in addition to a graph 902, a graph 904, a graph 906, a graph 908, a graph 910 and a graph 912, each of which share a common x-axis 914 in units of seconds. FIG. 9 additionally includes a line 916. Graph 902 has a y-axis in units of m/s$^2$ and includes a function 918. Graph 904 has a y-axis in units of m/s$^2$ and includes a function 920. Graph 906 has a y-axis in units of m/s$^2$ and includes a function 922. Graph 908 has a y-axis in units of degrees and includes a function 924. Graph 910 has a y-axis in units of degrees and includes a function 926. Graph 912 has a y-axis in units of degrees and includes a function 928.

Function 918 corresponds to the acceleration in a z-direction relative to parameter-detecting component 422. Function 920 corresponds to the acceleration in a y-direction relative to parameter-detecting component 422. Function 922 corresponds to the acceleration in an x-direction relative to parameter-detecting component 422. Function 924 corresponds to the angular acceleration in a yaw direction relative to parameter-detecting component 422. Function 926 corresponds to the angular acceleration in a pitch direction relative to parameter-detecting component 422. Function 928 corresponds to the angular acceleration in a roll direction relative to parameter-detecting component 422.

As noted, function 920, the acceleration in the y-direction, changes dramatically. This corresponds to the up and down motion of a person walking. Further, a spike 930 corresponds to motion of the person sitting into the vehicle. A second spike 932 corresponds to the large vibration coincident with starting of the vehicle. As discussed above, spikes 620, 622, 624 and 626 correspond to the detected magnetic field associated with ignition of the vehicle. Now these two separate parameters may be analyzed together to more clearly identify an event. In this example, a person is walking to, entering and starting a vehicle. As shown in each of functions 918, 920 and 922, the dramatic variations in detected acceleration in each axis (after the vehicle has been started as evidenced by the spikes in the detected magnetic fields of functions 612, 614, 616 and 618) may be explained by way of the vibrations of the vehicle now that it is running. This is particularly telling by function 918, or the acceleration in the z-axis (toward the vehicle). As the person is walking toward the vehicle, the constant walking velocity registers as no change in acceleration in this axis. However, after the vehicle is started, which shows as spike 934 in function 918, acceleration changes in the z-axis as a result of the vehicle vibrating from the engine.

Functions 924, 926 and 928 are shown here as further non-limiting examples of additional parameters that may be detected for use to identify a vehicle or location. In this example however, it should be noted that functions 928 includes a spike 936. This spike in the "roll" rotational axis is indicative that the device is being rolled, which may correspond to the phone being in the user's hand when entering the vehicle. This further supports the notion that a person is entering a vehicle. This, evidence in conjunction with the magnetic and acceleration signatures may be used to accurately identify the vehicle.

The additionally detected parameter, in the above example of FIG. 9, reduces the likelihood of false positive identification of a vehicle with only a magnetic signature. In accordance with aspects of the present invention, the use of additional parameter signatures may provide evidence to correctly identify a vehicle—or if the case may be—correctly identify a location.

In some embodiments, parameter-detecting component 422 may generate an output associated with the vehicle based any of functions 918, 920, 922, 924, 926, 928 and combinations thereof. In some embodiments, parameter-detecting component 422 may additionally process any of functions 918, 920, 922, 924, 926, 928 and combinations thereof to generate such an output. Non-limiting examples of further processes include averaging, adding, subtracting, and transforming any of functions 918, 920, 922, 924, 926, 928 and combinations thereof. In any of these embodiments, field-detecting component 412 may then generate a signature of the vehicle based any of functions 612, 614, 616, 618 and combinations thereof and based on the output generated by parameter-detecting component 422.

Figure 10:
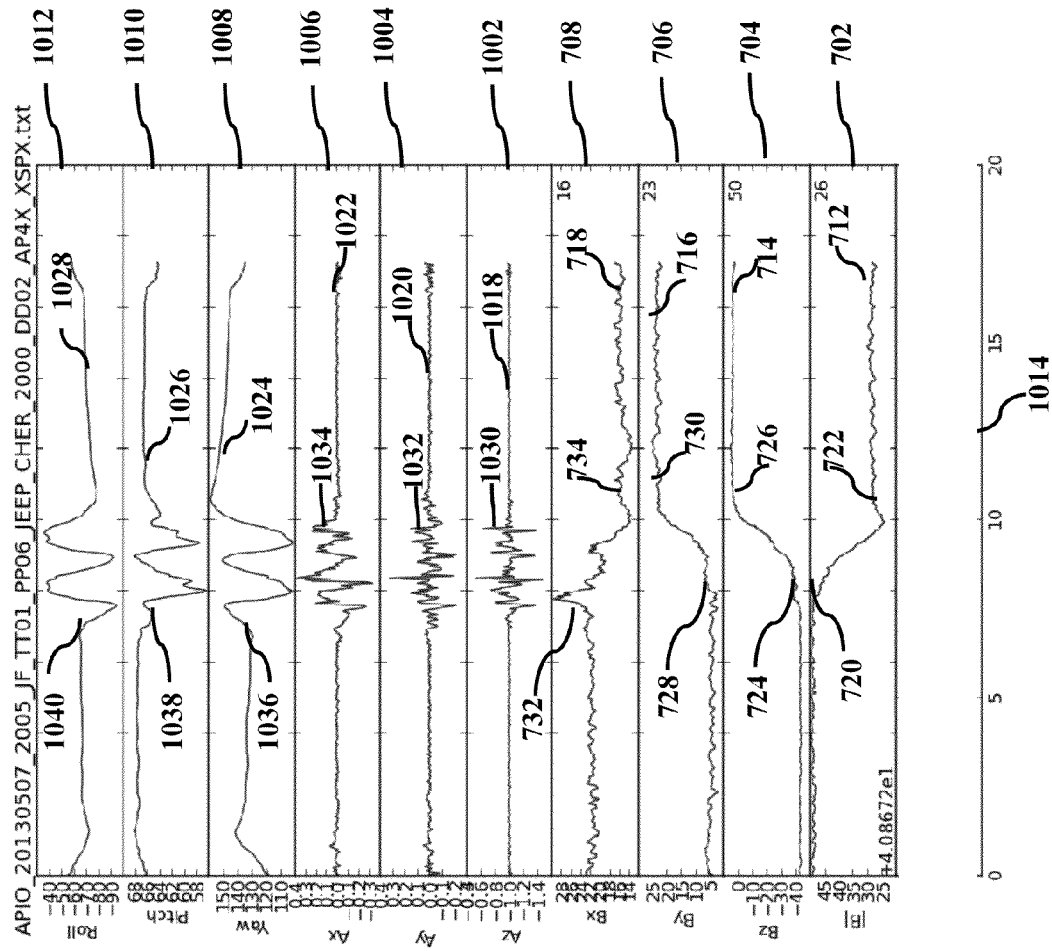
FIG. 10 illustrates another example of measured magnetic fields and of measured acceleration associated with a vehicle in accordance with aspects of the present invention.

FIG. 10 illustrates another example of measured magnetic fields and of measured acceleration associated with a vehicle in accordance with aspects of the present invention.

FIG. 10 includes graph 702, graph 704, graph 706 and graph 708, in addition to a graph 1002, a graph 1004, a graph 1006, a graph 1.008, a graph 1010 and a graph 1012, each of which share a common x-axis 1014 in units of seconds. FIG. 10 additionally includes a line 1016. Graph 1002 has a y-axis in units of m/s$^2$ and includes a function 1018. Graph 1004 has a y-axis in units of m/s$^2$ and includes a function 1020. Graph 1006 has a y-axis in units of m/s$^2$ and includes a function 1022. Graph 1008 has a y-axis in units of degrees and includes a function 1024. Graph 1010 has a y-axis in units of degrees and includes a function 1026. Graph 1012 has a y-axis in units of degrees and includes a function 1028.

Function 1018 corresponds to the acceleration in a z-direction relative to parameter-detecting component 422. Function 1020 corresponds to the acceleration in a y-direction relative to parameter-detecting component 422. Function 1022 corresponds to the acceleration in an x-direction relative to parameter-detecting component 422. Function 1024 corresponds to the angular acceleration in a yaw direction relative to parameter-detecting component 422. Function 1026 corresponds to the angular acceleration in a pitch direction relative to parameter-detecting component 422. Function 1028 corresponds to the angular acceleration in a roll direction relative to parameter-detecting component 422.

As discussed above with reference to FIGS. 6-7, by comparing the overall magnitudes of the detected magnetic fields between FIG. 9 and FIG. 10, it is clear that the fields are associated with two different vehicles. However, there are additional differences between the detected parameters worth noting. As noted by functions 1018, 1020 and 1022, the acceleration changes very little until changes in the detected magnetic field as noted by 720, 724, 728 and 732. At this point in time, as evidenced by variations 1030, 1032 and 1034, the acceleration-detecting component is "jostled" in all three axes. This corresponds to the relatively constant motion of a person walking, followed by the person entering the vehicle. Furthermore, as noted by function 1024, 1026 and 1028 there is a generally constant yaw pitch and roll until the changes in the detected magnetic field as noted by 720, 724, 728 and 732. At this point in time, as evidenced by double variations 1036, 1038 and 1040, the rotation-detecting component is "spun" in all three axes. These signatures, in conjunction with the relatively low acceleration as noted in functions 1018, 1020 and 1022, may be explained by the device being carried in a purse, for example. In such a case, being carried in a purse would buffer changes in acceleration, which is reflected in the relatively calm functions 1018, 1020 and 1022. When the person enters the vehicle and the purse is spun around and place in a seat, double variations 1036, 1038 and 1040 may result. This is further evidenced by the lack of acceleration or movement detected in any of functions 1018, 1020, 1022, 1024, 1026 and 1028 after entering the vehicle.

In some embodiments, parameter-detecting component 422 may generate an output associated with the vehicle based any of functions 1018, 1020, 1022, 1024, 1026, 1028 and combinations thereof. In some embodiments, parameter-detecting component 422 may additionally process any of functions 1018, 1020, 1022, 1024, 1026, 1028 and combinations thereof to generate such an output. Non-limiting examples of further processes include averaging, adding, subtracting, and transforming any of functions 1018, 1020, 1022, 1024, 1026, 1028 and combinations thereof. In any of these embodiments, field-detecting component 412 may then generate a signature of the vehicle based any of functions 612, 614, 616, 618 and combinations thereof and based on the output generated by parameter-detecting component 422.

Figure 11:
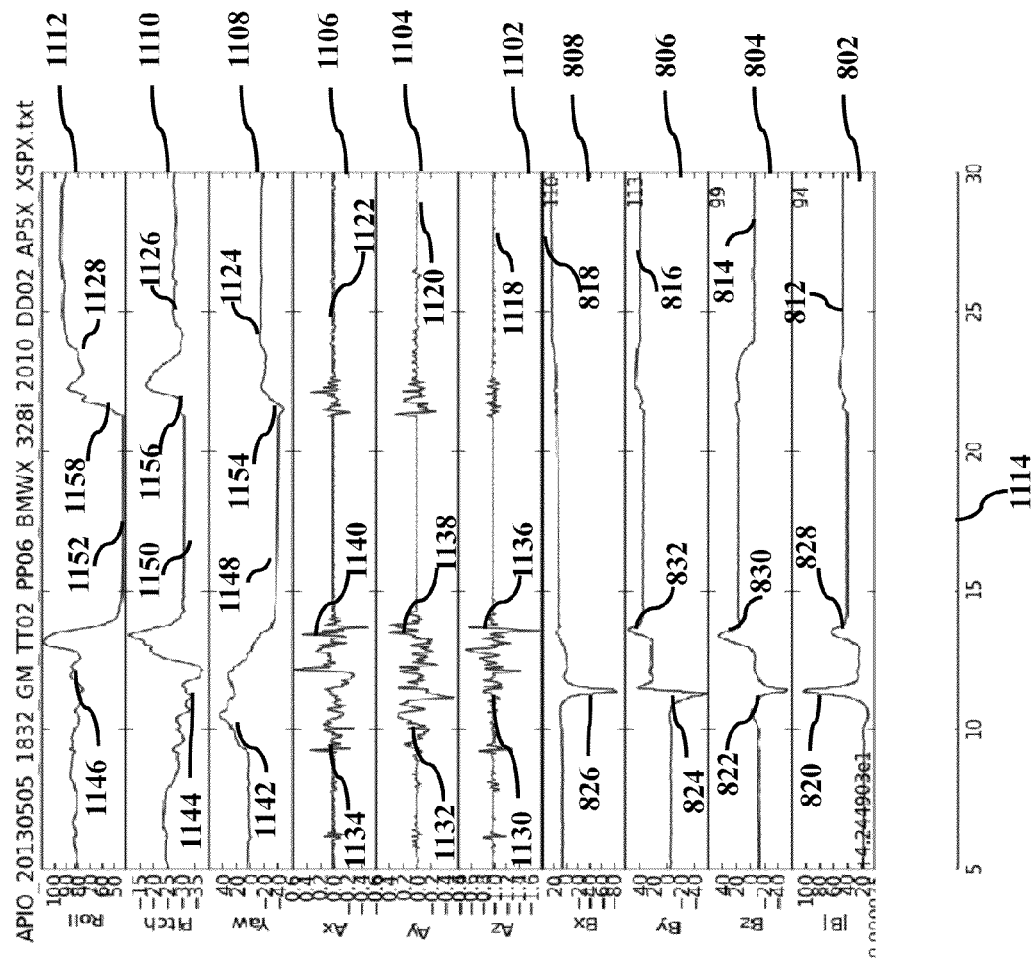
FIG. 11 illustrates another example of measured magnetic fields and of measured acceleration associated with a vehicle in accordance with aspects of the present invention.

FIG. 11 illustrates another example of measured magnetic fields and of measured acceleration associated with a vehicle in accordance with aspects of the present invention.

FIG. 11 includes graph 802, graph 804, graph 806 and graph 808, in addition to a graph 1102, a graph 1104, a graph 1106, a graph 1108, a graph 1110 and a graph 1112, each of which share a common x-axis 1114 in units of seconds. FIG. 11 additionally includes a line 1116. Graph 1102 has a y-axis in units of m/s$^2$ and includes a function 1118. Graph 1104 has a y-axis in units of m/s$^2$ and includes a function 1120. Graph 1106 has a y-axis in units of m/s$^2$ and includes a function 1122. Graph 1108 has a y-axis in units of degrees and includes a function 1124. Graph 1110 has a y-axis in units of degrees and includes a function 1126. Graph 1112 has a y-axis in units of degrees and includes a function 1128.

Function 1118 corresponds to the acceleration in a z-direction relative to parameter-detecting component 422. Function 1120 corresponds to the acceleration in a y-direction relative to parameter-detecting component 422. Function 1122 corresponds to the acceleration in an x-direction relative to parameter-detecting component 422. Function 1124 corresponds to the angular acceleration in a yaw direction relative to parameter-detecting component 422. Function 1126 corresponds to the angular acceleration in a pitch direction relative to parameter-detecting component 422. Function 1128 corresponds to the angular acceleration in a roll direction relative to parameter-detecting component 422.

By comparing the overall magnitudes of the detected magnetic fields between FIGS. 9-11, it is clear that the fields are associated with different vehicles. However, there are additional differences between the detected parameters worth noting. As noted by fluctuations 1130, 1132 and 1134 of functions 1118, 1120 and 1122, respectively, the acceleration changes drastically in correspondence with changes in the detected magnetic field as noted by 820, 822, 824 and 826. As discussed above, with reference to FIG. 8, this corresponds to entry into the vehicle. Further, as noted by spikes 1136, 1138 and 1140 of functions 1118, 1120 and 1122, respectively, the acceleration changes drastically in correspondence with changes in the detected magnetic field as noted by 828, 830 and 832. As discussed above, with reference to FIG. 8, this ignition of the vehicle. At this point in time, as evidenced by spikes 1136, 1138 and 1140, the acceleration detecting component is "jostled" in all three axes.

Furthermore, as noted by function 1124, 1126 and 1128 there is a generally constant yaw pitch and roll until the changes in the detected magnetic field as noted by 820, 822, 824 and 826. At this point in time, as evidenced by changes 1142, 1144 and 1146, the rotation-detecting component is "spun" in all three axes as a result of the person entering the vehicle. Then the yaw pitch and roll remain constant for a period indicated by portions 1148, 1150 and 1152 of functions 1124, 1126 and 1128, respectively. These signatures may be explained by the user setting the device down into one position after the entering the vehicle. At this point in time, as evidenced by changes 1142, 1144 and 1146, the rotation-detecting component is "spun" in all three axes as a result of the person entering the vehicle. Then the yaw pitch and roll again change as indicated by portions 1154, 1156 and 1158 of functions 1124, 1126 and 1128, respectively. These signatures may be explained by the person moving the device.

In some embodiments, parameter-detecting component 422 may generate an output associated with the vehicle based any of functions 1118, 1120, 1122, 1124, 1126, 1128 and combinations thereof. In some embodiments, parameter-detecting component 422 may additionally process any of functions 1118, 1120, 1122, 1124, 1126, 1128 and combinations thereof to generate such an output. Non-limiting examples of further processes include averaging, adding, subtracting, and transforming any of functions 1118, 1120, 1122, 1124, 1126, 1128 and combinations thereof. In any of these embodiments, field-detecting component 412 may then generate a signature of the vehicle based any of functions 612, 614, 616, 618 and combinations thereof and based on the output generated by parameter-detecting component 422.

In the examples discussed above with respect to FIGS. 9-11, just as with the examples discussed above with respect to FIGS. 6-8, the detected magnetic signals are easily distinguishable from one another. Accordingly, the vehicles associated therewith, respectively, may additionally be easily distinguishable from one another. However, in situations where the magnetic field signatures may be somewhat similar, it may be more difficult for a device in accordance with aspects of the present invention to distinguish vehicles—solely on the detected magnetic (or electric or electro-magnetic) fields. As such, the use of further distinguishing with at least a second detected parameter may help distinguish the vehicles.

In the examples discussed above with respect to FIGS. 9-11, parameter-detecting component 422 is detecting acceleration vectors as functions over a period of time. The detected acceleration signals illustrated in FIGS. 9-11 are easily distinguishable from one another. Accordingly, even if such vehicles had similar magnetic signatures, the vehicles associated with the detected acceleration signals, respectively, may additionally be easily distinguishable from one another.

The above discussed examples of FIGS. 9-11 are merely provided for purposes of explanation and are not limiting. Clearly, any other type of detectable parameter may be used to additionally distinguish an item or location in accordance with aspects of the present invention.

It should be noted that the detected fields and parameters in the examples discussed above with reference to FIGS. 6-11 are non-limiting examples. Each vehicle may have a distinct signature, just as each person may have a unique gait that will register a unique acceleration signature. An aspect of the present invention is the recording of a field signature, and in some cases an additional parameter signature, for future use to detect a vehicle or location.

In an example embodiment, field-detecting component 412 may detect magnetic field vectors associated with the approach and entry into vehicle 102, for example as discussed above with reference to FIGS. 1A-C, whereas parameter-detecting component 422 may detect three dimensional acceleration associated with the gait of person 104, the motion of person 104 opening door 108 and the motion of person 104 sitting in vehicle 102. An overall signature may be generated based on the signatures generated from each of field-detecting component 412 and parameter-detecting component 422.

In another example embodiment, field-detecting component 412 may detect magnetic field vectors associated with the inside of vehicle 102 while it is operating, whereas parameter-detecting component 422 may detect ambient noise associated with the running engine and road noise associated with vehicle 102 while it is operating. An overall signature may be generated based on the signatures generated from each of field-detecting component 412 and parameter-detecting component 422.

Returning to FIG. 3, after the item or location has been registered (S304), an item or location is detected (S306). For example, the next time the person approaches a vehicle, a device in accordance with aspects of the present invention would detect a field associated with the vehicle. Similarly, for example, the next time the person approaches a location, a device in accordance with aspects of the present invention would detect a field associated with the location. A more detailed discussion of registration will now be provided with additional reference to FIG. 12.

Figure 12:
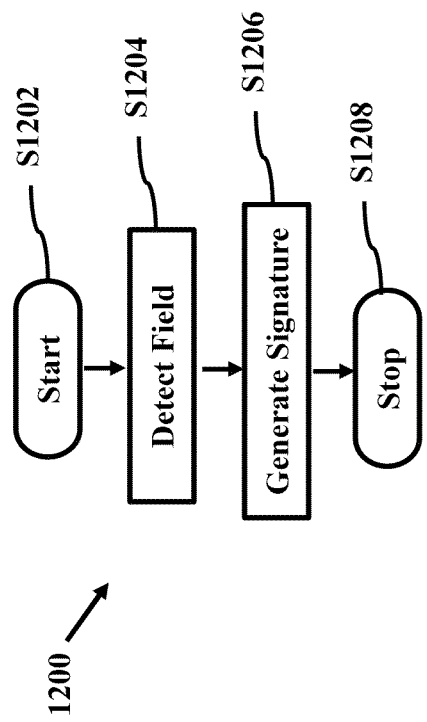
FIG. 12 illustrates an example method of detecting an item or a location in accordance with aspects of the present invention.

FIG. 12 illustrates an example method 1200 of detecting an item or a location in accordance with aspects of the present invention.

Method 1200 starts (S1202) and a field is detected (S1204). This is the same as the field being detected (S504) as discussed above with reference to method 500. For example, returning to FIG. 4, field-detecting component 412 detects a new field. For purposes of discussion, let the new field be a magnetic field corresponding to the superposition of magnetic fields generated by all electronic and mechanical systems involved with the ignition of a vehicle.

Returning to FIG. 12, once the field is detected (S1204), a signature is generated (S1206). This is similar to the signature being generated (S506) as discussed above with reference to method 500. In some embodiments, for example as shown in FIG. 4, field-detecting component 412 may generate a signature of the vehicle based any of functions 612, 614, 616, 618 of FIG. 6, and combinations thereof. In some embodiments, field-detecting component 412 may additionally process any of functions 612, 614, 616, 618 and combinations thereof to generate such a signature. Non-limiting examples of further processes include averaging, adding, subtracting, and transforming any of functions 612, 614, 616, 618 and combinations thereof.

This second signature is provided to comparing component 418 via communication line 448.

At this point, method 1200 stops (S1208).

Returning to FIG. 3, after the item or location has been detected (S306), it is verified (S308). For example, a device in accordance with aspects of the present invention would determine whether the newly detected vehicle is the vehicle that was previously registered. Similarly, a device in accordance with aspects of the present invention would determine whether the newly detected location is the location that was previously registered. A more detailed discussion of registration will now be provided with additional reference to FIG. 13.

Figure 13:
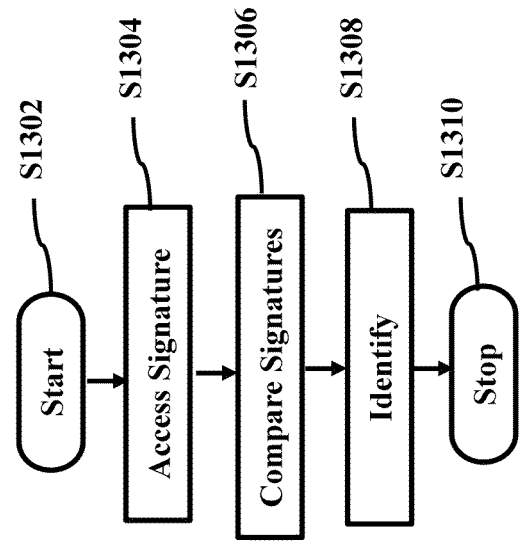
FIG. 13 illustrates an example method of verifying an item or a location in accordance with aspects of the present invention.

FIG. 13 illustrates an example method 1300 of verifying an item or a location in accordance with aspects of the present invention.

Method 1300 starts (S1302) and the previously stored signature is accessed (S1304). For example, as shown in FIG. 4, access component 416 retrieves the previously-stored signature from database 404 via communication line 454. Access component 416 then provides the retrieved, previously-stored signature to comparator 418 via communication line 456.

Returning to FIG. 13, now that the previously stored signature has been accessed (S1304), the signatures are compared (S1306). For example, as shown in FIG. 4, comparator 418 compares the retrieved, previously stored signature as provided by access component 416 with the newly generated signature as provided by field-detecting component 412.

Returning to FIG. 13, now that the signatures have been compared (S1306), the item/location may be identified (S1308). For example, as shown in FIG. 4, comparator 418 provides an output to identifying component 420 via communication line 458. If the retrieved, previously stored signature as provided by access component 416 matches the newly generated signature as provided by field-detecting component 412, then the newly detected item/location is the same item/location that was previously registered. In such a case, identifying component 420 may indicate that the newly detected item/location is the same item/location that was previously registered. If the retrieved, previously stored signature as provided by access component 416 does not match the newly generated signature as provided by field-detecting component 412, then the newly detected item/location is not the same item/location that was previously registered. In such a case, identifying component 420 may indicate that the newly detected item/location is the same item/location that was previously registered.

At this point, method 1300 stops (S1310).

Returning to FIG. 3, after the item or location has been verified, the data is updated (S310). For example, in some embodiments, as shown in FIG. 4, comparator 418 may determine that the previously stored signature as provided by access component 416 does not exactly match the newly generated signature as provided by field-detecting component 412, but the difference between the previously stored signature as provided by access component 416 does not exactly match the newly generated signature as provided by field-detecting component 412 is within a predetermined acceptable limit. In such cases, identifying component 420 may indicate that the newly detected item/location is still the same item/location that was previously registered. Further, comparator 418 may provide the newly generated signature as provided by field-detecting component 41.2 to access component 416 via communication line 456. Access component 416 may then provide the newly generated signature to database 404 via communication line 454.

In this manner, database 404 may be "taught" to accept variations of previously registered signatures. In some embodiments, an average of recognized signatures may be stored for future use. In some embodiments, a plurality of each recognized signature may be stored for future use.

Returning to FIG. 3, device 402 waits to detect a new field (S306).

The example embodiments discussed above are drawn to identifying an item or location using fields associated therewith. Once identified, other functions may be available. For example, consider the situation wherein a device in accordance with aspects of the present invention is embodied in a smartphone. In such an example, once an item (e.g., a vehicle) or a location (e.g., a house) is identified, the smartphone may institute a suite of applications and turn off other applications. In a specific example embodiment, the identification of a vehicle may be used to place a smartphone in a "Vehicle Mode," wherein the smartphone will operate in a particular manner because it is determined to be in a vehicle.

In accordance with aspects of the present invention discussed above, the sensors and functionalities of smartphones can be used to supplement or even replace the known vehicle-based techniques of vehicle telematics. More specifically, smartphone-to-smartphone (when both phones are in Vehicle Mode), smartphone-to-infrastructure and infrastructure-to-smartphone communications (again, when the smartphone is in Vehicle Mode) can provide drivers with a wide range of telematics services and features, while resulting in little or no additional cost to the vehicle driver (because she likely already has a smartphone) or the vehicle manufacturer (because it doesn't have to provide the purchaser of the vehicle with a smartphone and also doesn't have to embed costly vehicle telematics equipment in the vehicle). To be able to do so, however, the smartphone again has to be able to "know" that it is in Vehicle Mode and be able to determine in what vehicle it is. Ideally for various applications it is necessary to be able to determine if the smartphone is in the vehicle that is owned by the smartphone user. Aspects of the present invention enable a smartphone to know that it is in Vehicle Mode based on detected magnetic, electric, magneto-electric fields and combinations thereof.

Further in accordance with the present invention, a smartphone may utilize its magnetometer function to periodically measure the electromagnetic levels sensed at the smartphone's current location. The smartphone uses its processing capabilities to try to map the periodic electromagnetic levels sensed by the smartphone with the vehicular electromagnetic signatures stored in library. If the periodic electromagnetic levels sensed by the smartphone match any of the specific vehicle signatures stored in the library, then the processor of the smartphone may generate and/or otherwise output a signal indicating that the smartphone is located in the specific vehicle, which in turn will be used by the Vehicle Mode detection method to trigger certain functions.

The Vehicle Mode relevant sensor suite may be monitored at intervals depending on detected speed and location, for example, up to several times per second. The magneto metric sensor output may be monitored dependent on the accelerometer output as this will indicate a movement of the phone either within the vehicle environment or of the vehicle itself.

In the drawings and specification, there have been disclosed embodiments of the invention and, although specific terms are employed, they are used in a generic and descriptive sense only and not for purposes of limitation, the scope of the invention being set forth in the following claims.

What is claimed as new and desired to be protected by Letters Patent of the United States is:

1. A device, for use with a database, said device comprising:
    a field-detecting component operable to detect at least one of an electric field, a magnetic field and an electro-magnetic field and to generate a detected field signature based on the detected one of an electric field, a magnetic field and an electro-magnetic field;
    an input component operable to input the detected field signature into the database;
    an accessing component operable to access the detected field signature from the database;
    a comparing component operable to generate a comparison signal; and
    an identifying component operable to identify one of an item and a location based on the comparison signal,
    wherein said field-detecting component is further operable to detect a second one of an electric field, a magnetic field and an electro-magnetic field and to generate a second detected field signature based on the detected second one of an electric field, a magnetic field and an electro-magnetic field, and
    wherein said comparing component is operable to generate the comparison signal based on a comparison of the detected field signature and the second detected field signature.

2. The device of claim 1, wherein said field-detecting component is operable to detect the at least one of an electric field, a magnetic field and an electro-magnetic field as a function over a period of time.

3. The device of claim 1, further comprising:
    a parameter-detecting component operable to detect a parameter and to generate a parameter signal based on the detected parameter,
    wherein said identifying component is operable to identify the one of an item and a location based additionally on the parameter signal.

4. The device of claim 3, wherein said parameter-detecting component is operable to detect, as the parameter, one of the group consisting of a velocity, acceleration, angular velocity, angular acceleration, geodetic position, sound, temperature, vibrations, pressure, biometrics, contents of surrounding atmosphere and combinations thereof.

5. The device of claim 1, further comprising a communication component operable to wirelessly communicate with a network.

6. The device of claim 1,
    wherein said field-detecting component is operable to detect a magnetic field,
    wherein said input component is further operable to input an association between a vehicle and the detected magnetic field,
    wherein said field-detecting component is further operable to detect a second magnetic field and to generate a second detected field signature based on the detected second magnetic field, and
    wherein said identifying component is further operable, based on the association, to identify the vehicle as the item.

7. The device of claim 6, further comprising:
    a verification component operable to provide a request for verification based on the comparison signal and the association,
    wherein said input component is further operable to input a verification based on the request for verification.

8. A method, for use with a database, said method comprising:
    detecting, via a field-detecting component, at least one of an electric field, a magnetic field and an electro-magnetic field;
    generating, via the field-detecting component, a detected field signature based on the detected one of an electric field, a magnetic field and an electro-magnetic field;
    inputting, via an input component, the detected field signature into the database;
    accessing, via an accessing component, the detected field signature from the database;
    generating, via a comparing component, a comparison signal;
    identifying, via an identifying component, one of an item and a location based on the comparison signal;
    detecting, via the field-detecting component, a second one of an electric field, a magnetic field and an electro-magnetic field; and generating, via the field-detecting component, a second detected field signature based on the detected second one of an electric field, a magnetic field and an electro-magnetic field,
wherein said generating a comparison signal comprises generating the comparison signal based on a comparison of the detected field signature and the second detected field signature.

9. The method of claim 8, wherein said detecting comprises detecting the at least one of an electric field, a magnetic field and an electro-magnetic field as a function over a period of time.

10. The method of claim 8, further comprising:
detecting, via a parameter-detecting component, a parameter; and
generating, via the parameter-detecting component, a parameter signal based on the detected parameter,
wherein said identifying comprises identifying the one of an item and a location based additionally on the parameter signal.

11. The method of claim 10, wherein said detecting a parameter comprises detecting, as the parameter, one of the group consisting of a velocity, acceleration, angular velocity, angular acceleration, geodetic position, sound, temperature, vibrations, pressure, biometrics, contents of surrounding atmosphere and combinations thereof.

12. The method of claim 8, further comprising wirelessly communicating, via a communication component, with a network.

13. The method of claim 8, further comprising:
inputting, via the input component is further operable to input an association; and
identifying, via the identifying component, a vehicle,
wherein said detecting, via a field-detecting component, at least one of an electric field, a magnetic field and an electro-magnetic field comprises detecting detect a magnetic field,
wherein said inputting an association comprises inputting an association between a vehicle and the detected magnetic field,
wherein said detecting a second one of an electric field, a magnetic field and an electro-magnetic field comprises detecting a second magnetic field,
wherein said generating a second detected field signature comprises generating a second detected field signature based on the detected second magnetic field, and
wherein said identifying a vehicle comprises identifying, based on the association, the vehicle as the item.

14. The method of claim 13, further comprising:
providing, via a verification component, operable to provide a request for verification based on the comparison signal and the association; and
inputting, via the input component, a verification based on the request for verification.

15. A non-transitory, tangible, computer-readable media having computer-readable instructions stored thereon, for use with a database, the computer-readable instructions being capable of being read by a computer and being capable of instructing the computer to perform the method comprising:
detecting, via a field-detecting component, at least one of an electric field, a magnetic field and an electro-magnetic field;
generating, via the field-detecting component, a detected field signature based on the detected one of an electric field, a magnetic field and an electro-magnetic field;
inputting, via an input component, the detected field signature into the database;
accessing, via an accessing component, the detected field signature from the database;
generating, via a comparing component, a comparison signal;
identifying, via an identifying component, one of an item and a location based on the comparison signal;
detecting, via the field-detecting component, a second one of an electric field, a magnetic field and an electro-magnetic field; and
generating, via the field-detecting component, a second detected field signature based on the detected second one of an electric field, a magnetic field and an electro-magnetic field,
wherein said generating a comparison signal comprises generating the comparison signal based on a comparison of the detected field signature and the second detected field signature.

16. The non-transitory, tangible, computer-readable media of claim 15, wherein the computer-readable instructions are capable of instructing the computer to perform the method such that said detecting comprises detecting the at least one of an electric field, a magnetic field and an electro-magnetic field as a function over a period of time.

17. The non-transitory, tangible, computer-readable media of claim 15, the computer-readable instructions being capable of being read by a computer and being capable of instructing the computer to perform the method further comprising:
detecting, via a parameter-detecting component, a parameter; and
generating, via the parameter-detecting component, a parameter signal based on the detected parameter,
wherein said identifying comprises identifying the one of an item and a location based additionally on the parameter signal.

18. The non-transitory, tangible, computer-readable media of claim 17, wherein the computer-readable instructions are capable of instructing the computer to perform the method such that said detecting a parameter comprises detecting, as the parameter, one of the group consisting of a velocity, acceleration, angular velocity, angular acceleration, geodetic position, sound, temperature, vibrations, pressure, biometrics, contents of surrounding atmosphere and combinations thereof.

19. The non-transitory, tangible, computer-readable media of claim 15, the computer-readable instructions being capable of being read by a computer and being capable of instructing the computer to perform the method further comprising wirelessly communicating, via a communication component, with a network.

20. The non-transitory, tangible, computer-readable media of claim 15, the computer-readable instructions being capable of instructing the computer to perform the method further comprising:
inputting, via the input component is further operable to input an association; and
identifying, via the identifying component, a vehicle,
wherein said detecting, via a field-detecting component, at least one of an electric field, a magnetic field and an electro-magnetic field comprises detecting detect a magnetic field,
wherein said inputting an association comprises inputting an association between a vehicle and the detected magnetic field,
wherein said detecting a second one of an electric field, a magnetic field and an electro-magnetic field comprises detecting a second magnetic field, wherein said generating a second detected field signature comprises generating a second detected field signature based on the detected second magnetic field, and wherein said identifying a vehicle comprises identifying, based on the association, the vehicle as the item.

21. The non-transitory, tangible, computer-readable media of claim 20, the computer-readable instructions being capable of instructing the computer to perform the method further comprising:

providing, via a verification component, operable to provide a request for verification based on the comparison signal and the association; and inputting, via the input component, a verification based on the request for verification.

22. A device, for use with a database having stored therein, at least one of a first plurality of signatures, a second plurality of signatures and a third plurality of signatures, the first plurality of signatures corresponding to a plurality of electric fields, respectively, the second plurality of signatures corresponding to a plurality of magnetic fields, respectively, the third plurality of signatures corresponding to a plurality of electro-magnetic fields, respectively, said device comprising:

an accessing component operable to access one of the first plurality of signatures, the second plurality of signatures and the third plurality of signatures from the database;

a field-detecting component operable to detect at least one of an electric field, a magnetic field and an electro-magnetic field and to generate a detected field signature based on the detected one of said fields;

a comparing component operable to generate a comparison signal; and an identifying component operable to identify one of an item and a location based on the comparison signal, wherein, when said field-detecting component is operable to detect an electric field, said comparison component is operable to generate the comparison signal based on a comparison of the detected field signature and the first plurality of signatures, wherein, when said field-detecting component is operable to detect a magnetic field, said comparison component is operable to generate the comparison signal based on a comparison of the detected field signature and the second plurality of signatures, and wherein, when said field-detecting component is operable to detect an electro-magnetic field, said comparison component is operable to generate the comparison signal based on a comparison of the detected field signature and the third plurality of signatures.

23. The device of claim 22, wherein said field-detecting component is operable to detect the at least one of an electric field, a magnetic field and an electro-magnetic field as a function over a period of time.

24. The device of claim 22, further comprising:

a parameter-detecting component operable to detect a parameter and to generate a parameter signal based on the detected parameter, wherein said identifying component is operable to identify the one of an item and a location based additionally on the parameter signal.

25. The device of claim 24, wherein said parameter-detecting component is operable to detect, as the parameter, one of the group consisting of a velocity, acceleration, angular velocity, angular acceleration, geodetic position, sound, temperature, vibrations, pressure, biometrics, contents of surrounding atmosphere and combinations thereof.

26. The device of claim 22, further comprising a communication component, operable to wirelessly communicate with a network.

27. The device of claim 22, wherein said field-detecting component is operable to detect a magnetic field, wherein said input component is further operable to input an association between a vehicle and the detected magnetic field, wherein said field-detecting component is further operable to detect a second magnetic field and to generate a second detected field signature based on the detected second magnetic field, and wherein said identifying component is further operable, based on the association, to identify the vehicle as the item.

28. The device of claim 27, further comprising:

a verification component operable to provide a request for verification based on the comparison signal and the association, wherein said input component is further operable to input a verification based on the request for verification.

29. A method, for use with a database having stored therein, at least one of a first plurality of signatures, a second plurality of signatures and a third plurality of signatures, the first plurality of signatures corresponding to a plurality of electric fields, respectively, the second plurality of signatures corresponding to a plurality of magnetic fields, respectively, the third plurality of signatures corresponding to a plurality of electro-magnetic fields, respectively, said method comprising:

accessing, via an accessing component, one of the first plurality of signatures, the second plurality of signatures and the third plurality of signatures from the database;

detecting, via a field-detecting component, at least one of an electric field, a magnetic field and an electro-magnetic field;

generating, via a field-detecting component, a detected field signature based on the detected one of an electric field, a magnetic field and an electro-magnetic field;

generating, via a comparing component, a comparison signal; and identifying, via an identifying component, one of an item and a location based on the comparison signal, wherein, when said detecting comprises detecting an electric field, said generating comprises generating the comparison signal based on a comparison of the detected field signature and the first plurality of signatures, wherein, when said detecting comprises detecting a magnetic field, said generating comprises generating the comparison signal based on a comparison of the detected field signature and the second plurality of signatures, and wherein, when said detecting comprises detecting an electro-magnetic field, said generating comprises generating the comparison signal based on a comparison of the detected field signature and the third plurality of signatures.

30. The method of claim 29, wherein said detecting comprises detecting the at least one of an electric field, a magnetic field and an electro-magnetic field as a function over a period of time.

31. The method of claim 29, further comprising:

detecting, via a parameter-detecting component, a parameter; and generating, via the parameter-detecting component, a parameter signal based on the detected parameter, wherein said identifying comprises identifying the one of an item and a location based additionally on the parameter signal.

32. The method of claim 31, wherein said detecting a parameter comprises detecting, as the parameter, one of the group consisting of velocity, acceleration, angular velocity, angular acceleration, geodetic position, sound, temperature, vibrations, pressure, biometrics, contents of surrounding atmosphere and combinations thereof.

33. The method of claim 29, further comprising wirelessly communicating, via a communication component, with a network.

34. The method of claim 29, further comprising:
inputting, via the input component is further operable to input an association; and
identifying, via the identifying component, a vehicle,
wherein said detecting, via a field-detecting component, at least one of an electric field, a magnetic field and an electro-magnetic field comprises detecting detect a magnetic field,
wherein said inputting an association comprises inputting an association between a vehicle and the detected magnetic field,
wherein said detecting a second one of an electric field, a magnetic field and an electro-magnetic field comprises detecting a second magnetic field,
wherein said generating a second detected field signature comprises generating a second detected field signature based on the detected second magnetic field, and
wherein said identifying a vehicle comprises identifying, based on the association, the vehicle as the item.

35. The method of claim 34, further comprising:
providing, via a verification component, operable to provide a request for verification based on the comparison signal and the association; and
inputting, via the input component, a verification based on the request for verification.

36. A non-transitory, tangible, computer-readable media having computer-readable instructions stored thereon, for use with a database having stored therein, at least one of a first plurality of signatures, a second plurality of signatures and a third plurality of signatures, the first plurality of signatures corresponding to a plurality of electric fields, respectively, the second plurality of signatures corresponding to a plurality of magnetic fields, respectively, the third plurality of signatures corresponding to a plurality of electro-magnetic fields, respectively, the computer-readable instructions being capable of being read by a computer and being capable of instructing the computer to perform the method comprising:
accessing, via an accessing component, one of the first plurality of signatures, the second plurality of signatures and the third plurality of signatures from the database;
detecting, via a field-detecting component, at least one of an electric field, a magnetic field and an electro-magnetic field;
generating, via a field-detecting component, a detected field signature based on the detected one of an electric field, a magnetic field and an electro-magnetic field;
generating, via a comparing component, a comparison signal; and
identifying, via an identifying component, one of an item and a location based on the comparison signal,
wherein, when said detecting comprises detecting an electric field, said generating comprises generating the comparison signal based on a comparison of the detected field signature and the first plurality of signatures,
wherein, when said detecting comprises detecting a magnetic field, said generating comprises generating the comparison signal based on a comparison of the detected field signature and the second plurality of signatures, and
wherein, when said detecting comprises detecting an electro-magnetic field, said generating comprises generating the comparison signal based on a comparison of the detected field signature and the third plurality of signatures.

37. The non-transitory, tangible, computer-readable media of claim 36, wherein the computer-readable instructions are capable of instructing the computer to perform the method such that said detecting comprises detecting the at least one of an electric field, a magnetic field and an electro-magnetic field as a function over a period of time.

38. The non-transitory, tangible, computer-readable media of claim 36, the computer-readable instructions being capable of being read by a computer and being capable of instructing the computer to perform the method further comprising:
detecting, via a parameter-detecting component, a parameter; and
generating, via the parameter-detecting component, a parameter signal based on the detected parameter,
wherein said identifying comprises identifying the one of an item and a location based additionally on the parameter signal.

39. The non-transitory, tangible, computer-readable media of claim 38, wherein the computer-readable instructions are capable of instructing the computer to perform the method such that said detecting a parameter comprises detecting, as the parameter, one of the group consisting of velocity, acceleration, angular velocity, angular acceleration, geodetic position, sound, temperature, vibrations, pressure, biometrics, contents of surrounding atmosphere and combinations thereof.

40. The non-transitory, tangible, computer-readable media of claim 36, the computer-readable instructions being capable of being read by a computer and being capable of instructing the computer to perform the method further comprising wirelessly communicating, via a communication component, with a network.

41. The non-transitory, tangible, computer-readable media of claim 36, the computer-readable instructions being capable of instructing the computer to perform the method further comprising:
inputting, via the input component is further operable to input an association; and
identifying, via the identifying component, a vehicle,
wherein said detecting, via a field-detecting component, at least one of an electric field, a magnetic field and an electro-magnetic field comprises detecting detect a magnetic field,
wherein said inputting an association comprises inputting an association between a vehicle and the detected magnetic field,
wherein said detecting a second one of an electric field, a magnetic field and an electro-magnetic field comprises detecting a second magnetic field,
wherein said generating a second detected field signature comprises generating a second detected field signature based on the detected second magnetic field, and
wherein said identifying a vehicle comprises identifying, based on the association, the vehicle as the item.

42. The non-transitory, tangible, computer-readable, media of claim 41, the computer-readable instructions being capable of instructing the computer to perform the method further comprising:
 providing, via a verification component, operable to provide a request for verification based on the comparison signal and the association; and
 inputting, via the input component, a verification based on the request for verification.

\* \* \* \* \*